US012654435B2

(12) United States Patent
Cheng et al.

(10) Patent No.: US 12,654,435 B2
(45) Date of Patent: Jun. 16, 2026

(54) PRINTING SYSTEM AND METHOD FOR CONTROLLING PRINTING SYSTEM

(71) Applicant: Illinois Tool Works Inc., Glenview, IL (US)

(72) Inventors: Zaizai Cheng, Glenview (CN); Liang Zhu, Jiaxing (CN)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 18/895,706

(22) Filed: Sep. 25, 2024

(65) Prior Publication Data

US 2025/0108597 A1     Apr. 3, 2025

(30) Foreign Application Priority Data

Sep. 28, 2023    (CN) .......................... 202311280466.7

(51) Int. Cl.
B41F 15/26        (2006.01)
B41F 15/08        (2006.01)
                    (Continued)

(52) U.S. Cl.
CPC .............. B41F 15/26 (2013.01); B41F 15/08 (2013.01); B41F 21/00 (2013.01); B41F 33/00 (2013.01);
                    (Continued)

(58) Field of Classification Search
None
See application file for complete search history.

(56) References Cited

U.S. PATENT DOCUMENTS 5,694,843 A     12/1997  Chen
2016/0297189 A1 * 10/2016  Mariano  .............. H05K 3/1216

FOREIGN PATENT DOCUMENTS

CN        108040474 A     5/2018
CN        108419428 B     8/2021
                    (Continued)

*Primary Examiner* — Joshua D Zimmerman

(74) *Attorney, Agent, or Firm* — Lando & Anastasi, LLP

(57)            ABSTRACT

The present disclosure provides a printing system and a method for controlling a printing system. The printing system is used to print on a board, and includes at least one pair of adjustment assemblies. Each of the at least one pair of adjustment assemblies includes a carrying component, an alignment component and a drive component. The carrying component is configured to carry the board. The drive component is configured to be capable of driving the carrying component and the alignment component to move and is configured to adjust a distance between an upper surface of the carrying component and an upper surface of the alignment component to be equal to the thickness of the board. The structure of the printing system of the present disclosure enables a height difference between the upper surface of the alignment component and the upper surface of the carrying component to be adjusted according to the thickness of the board to be processed, such that the height difference between the upper surface of the alignment component and the upper surface of the carrying component is equal to the thickness of the board to be processed, so as to adapt to boards of different thicknesses to be processed.

11 Claims, 16 Drawing Sheets

(51) Int. Cl.
     *B41F 21/00*        (2006.01)
     *B41F 33/00*        (2006.01)
     *H05K 3/00*         (2006.01)
     *H05K 3/12*         (2006.01)

(52) U.S. Cl.
     CPC ......... *H05K 3/0008* (2013.01); *H05K 3/1225*
                 (2013.01); *H05K 2203/1509* (2013.01)

(56)                References Cited

FOREIGN PATENT DOCUMENTS

| | | | |
|----|----------------|-----|---------|
| CN | 114423272 | A   | 4/2022  |
| CN | 115515323 | A   | 12/2022 |
| JP | H10-296948 | A   | 11/1998 |
| JP | 2008114521 | A   | 5/2008  |
| JP | 2018-512309 | A   | 5/2018  |
| TW | 202123789 | A   | 6/2021  |
| WO | 2017/022109 | A1  | 2/2017  |
| WO | 2018/070016 | A1  | 4/2018  |

* cited by examiner

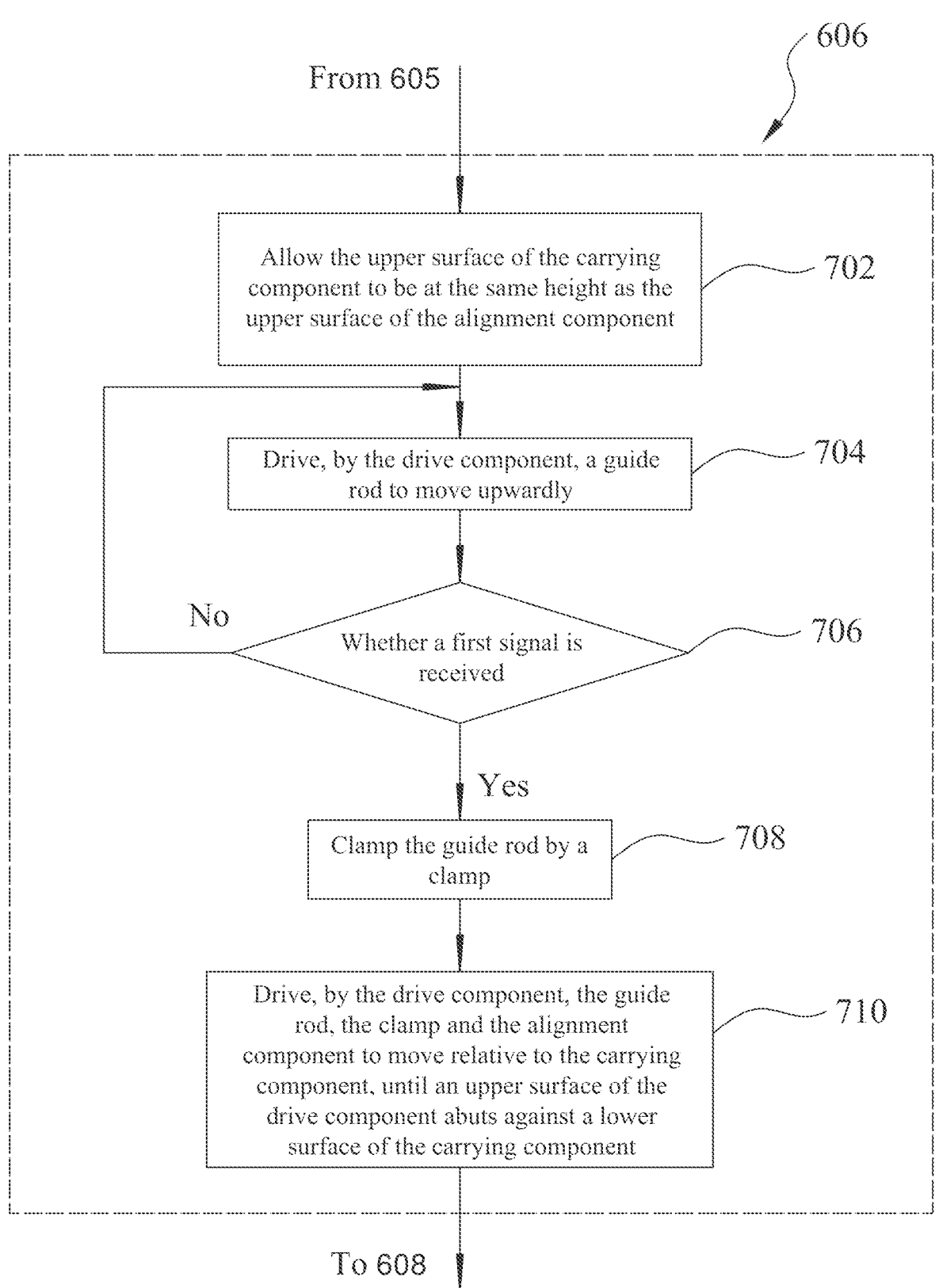

From 605

606

Allow the upper surface of the carrying component to be at the same height as the upper surface of the alignment component — 702

Drive, by the drive component, a guide rod to move upwardly — 704

Whether a first signal is received — 706

No

Yes

Clamp the guide rod by a clamp — 708

Drive, by the drive component, the guide rod, the clamp and the alignment component to move relative to the carrying component, until an upper surface of the drive component abuts against a lower surface of the carrying component — 710

PRINTING SYSTEM AND METHOD FOR CONTROLLING PRINTING SYSTEM

CROSS REFERENCED APPLICATIONS

This application claims priority to Chinese Application No. 202311280466.7, titled "PRINTING SYSTEM AND METHOD FOR CONTROLLING PRINTING SYSTEM," filed Sep. 28, 2023, which is incorporated herein by reference in its entirety for all purposes.

TECHNICAL FIELD

The present disclosure relates to a printing system.

BACKGROUND

A printing system includes a printing device and a wire screen. upper surface of a board (e.g., PCB) to be processed is attached to or abuts against a lower surface of the wire screen, such that the printing device can print a pattern of the wire screen on the board to be processed. There is therefore a need for a printing system that enables the upper surface of the board (e.g., PCB) to be processed to abut against the lower surface of the wire screen.

SUMMARY OF THE DISCLOSURE

The present disclosure provides a printing system for printing a board, the printing system including at least one pair of adjustment assemblies. Each of the at least one pair of adjustment assemblies includes a carrying component, an alignment component and a drive component. The carrying component is configured to carry the board. The drive component is configured to be capable of driving the carrying component and the alignment component to move and is configured to adjust a distance between an upper surface of the carrying component and an upper surface of the alignment component to be equal to the thickness of the board.

According to the printing system described above, each of the at least one pair of adjustment assemblies further includes a transmission assembly. The transmission assembly includes a guide rod and a clamp. The drive component is capable of driving the guide rod to move. The clamp is arranged on the alignment component and is configured to be capable of clamping or releasing the guide rod.

According to the printing system described above, the transmission assembly is configured such that:

when the clamp releases the guide rod, the drive component is capable of driving the guide rod to move relative to the carrying component and the alignment component; and when the clamp clamps the guide rod, the drive component is capable of driving the guide rod and the alignment component to move relative to the carrying component.

According to the printing system described above, the carrying component, the guide rod and the drive component are configured such that: when the drive component drives the carrying component to move, the drive component drives the guide rod to move.

According to the printing system described above, the carrying component is provided with a through hole, and the guide rod is capable of passing through the through hole.

According to the printing system described above, the drive component is configured to be capable of driving the carrying component, the alignment component, the guide rod and the clamp to move along a first direction.

According to the printing system described above, the drive components of the at least one pair of adjustment assemblies are the same drive plate.

According to the printing system described above, the printing system further includes a wire screen, wherein the wire screen and the drive component are arranged on opposite sides of the carrying component and the alignment component. The drive component is configured to be capable of driving the board carried by the carrying component and the alignment component to be attached to a lower surface of the wire screen.

The present disclosure also provides a method for controlling a printing system, the method including:

obtaining the thickness of a board;

driving a carrying component and an alignment component by means of a drive component to move so as to adjust a height difference between an upper surface of the carrying component and an upper surface of the alignment component to be equal to the thickness of the board and making the upper surface of the carrying component to be lower than the upper surface of the alignment component.

The method for controlling a printing system described above further includes:

driving the carrying component, the board and the alignment component by means of the drive component to move until the upper surface of the alignment component is attached to a lower surface of a wire screen, after the step of driving a carrying component and an alignment component by means of a drive component to move so as to adjust a height difference between an upper surface of the carrying component and an upper surface of the alignment component to be equal to the thickness of the board and making the upper surface of the carrying component to be lower than the upper surface of the alignment component.

According to the method for controlling a printing system described above, the step of driving a carrying component and an alignment component by means of a drive component to move so as to adjust a height difference between an upper surface of the carrying component and an upper surface of the alignment component to be equal to the thickness of the board and making the upper surface of the carrying component to be lower than the upper surface of the alignment component includes:

allowing the upper surface of the carrying component to be at the same height as the upper surface of the alignment component;

driving a guide rod by means of the drive component to move until a distance between an upper surface of the drive component and a lower surface of the carrying component is equal to the thickness of the board;

clamping the guide rod by means of a clamp arranged on the alignment component;

driving the guide rod and the alignment component by means of the drive component to move until the height difference between the upper surface of the carrying component and the upper surface of the alignment component is equal to the thickness of the board.

The structure of the printing system of the present disclosure enables a height difference between the upper surface of the alignment component and the upper surface of the carrying component to be adjusted according to the thickness of the board to be processed, such that the height difference between the upper surface of the alignment component and the upper surface of the carrying component is equal to the thickness of the board to be processed, so as to adapt to boards of different thicknesses to be processed.

Other features, advantages and embodiments of the present disclosure may be elaborated or become apparent by considering the following specific embodiments, accompanying drawings and claims. Furthermore, it should be appreciated that the summary and the following specific embodiments are all exemplary, and are intended to provide a further explanation, but not to limit the scope of protection of the present disclosure. However, the specific embodiments and specific examples merely indicate preferred embodiments of the present disclosure. For those skilled in the art, various variations and modifications within the spirit and scope of the present disclosure will become apparent by the way of the specific embodiments.

BRIEF DESCRIPTION OF THE DRAWINGS

The features and advantages of the present disclosure may be better understood by reading the following detailed description with reference to the accompanying drawings. In all the accompanying drawings, the same reference numerals represent the same parts, in the figures:

FIG. 7 is a detailed control flow chart of step 606 shown in FIG. 6; and

DETAILED DESCRIPTION OF EMBODIMENTS

Various specific embodiments of the present disclosure are described below with reference to the drawings which constitute part of this description.

Figure 1A:
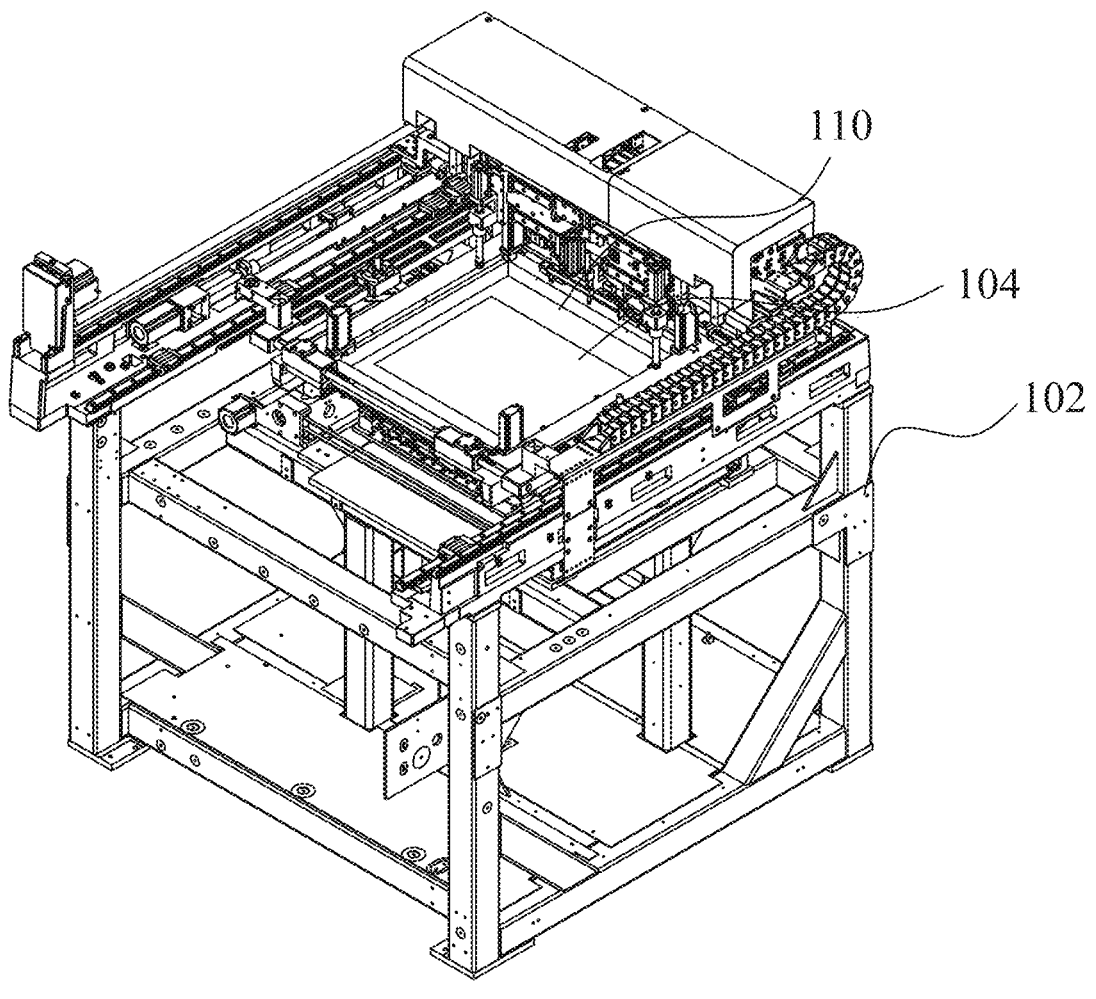
FIG. 1A is a perspective view of a printing system according to the present disclosure.

FIG. 1A is a perspective view of a printing system according to the present disclosure. As shown in FIG. 1A, the printing system is used to print a board 106 to be processed (see FIG. 1B). Specifically, the printing system includes a base 102, a wire screen 104, a printing device (not shown), and a wire screen support device 110. The wire screen support device 110 is arranged on the base 102. The wire screen support device 110 is used to support the wire screen 104 and to arrange the wire screen 104 at a distance from the base 102. The printing device configured to be capable of printing, is arranged above the wire screen 104, and can move relative to the wire screen 104. The wire screen 104 is provided with perforations. The perforations form a predetermined pattern. When it is necessary to print the board 106 to be processed, an upper surface of the board 106 to be processed first abuts against a lower surface of the wire screen 104, and a print head (not shown) of the printing device abuts against an upper surface of the wire screen 104 and moves relative to the wire screen 104, such that the predetermined pattern is printed on the upper surface of the board 106.

Figure 1B:
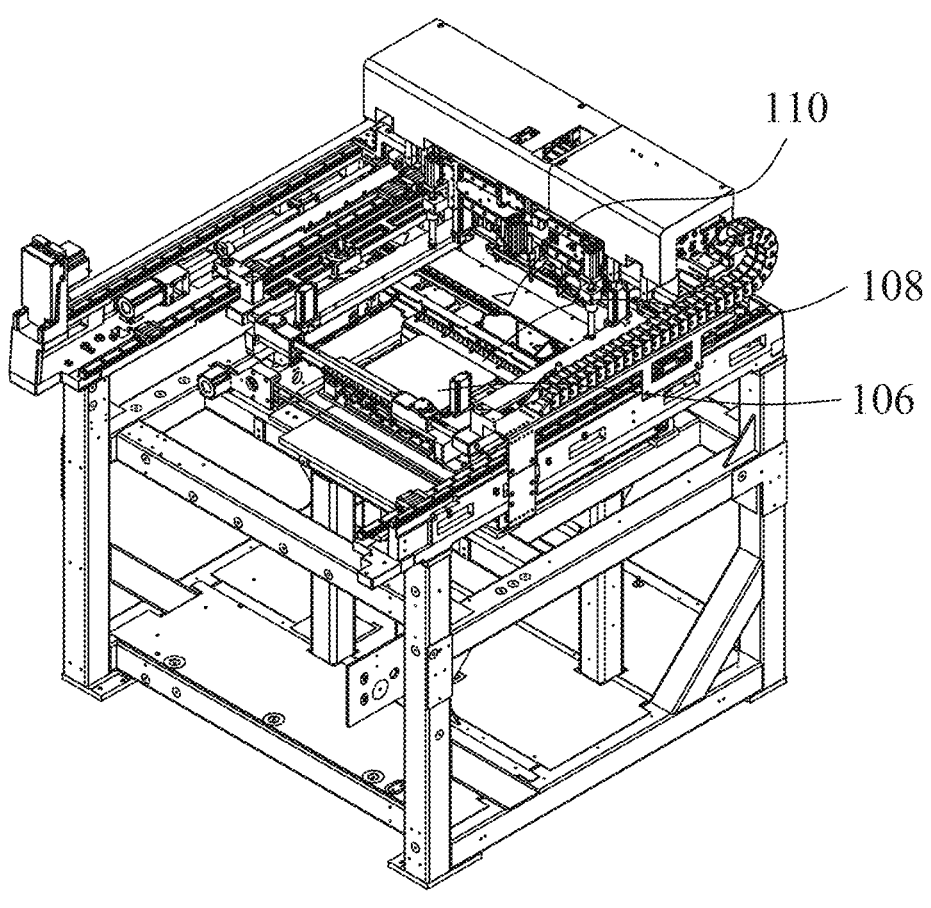
FIG. 1B is a perspective view of the printing system shown in FIG. 1A.

FIG. 1B is a perspective view of the printing system shown in FIG. 1A, with the wire screen 104 not shown in FIG. 1B. As shown in FIG. 1B, the printing system further includes a pair of adjustment assemblies 108. The adjustment assembly 108 is arranged below the wire screen 104 and is configured to carry the board 106. The adjustment assembly 108 can move relative to the wire screen 104 to transport the board 106, such that the upper surface of the board 106 abuts against the lower surface of the wire screen 104.

Figure 2A:
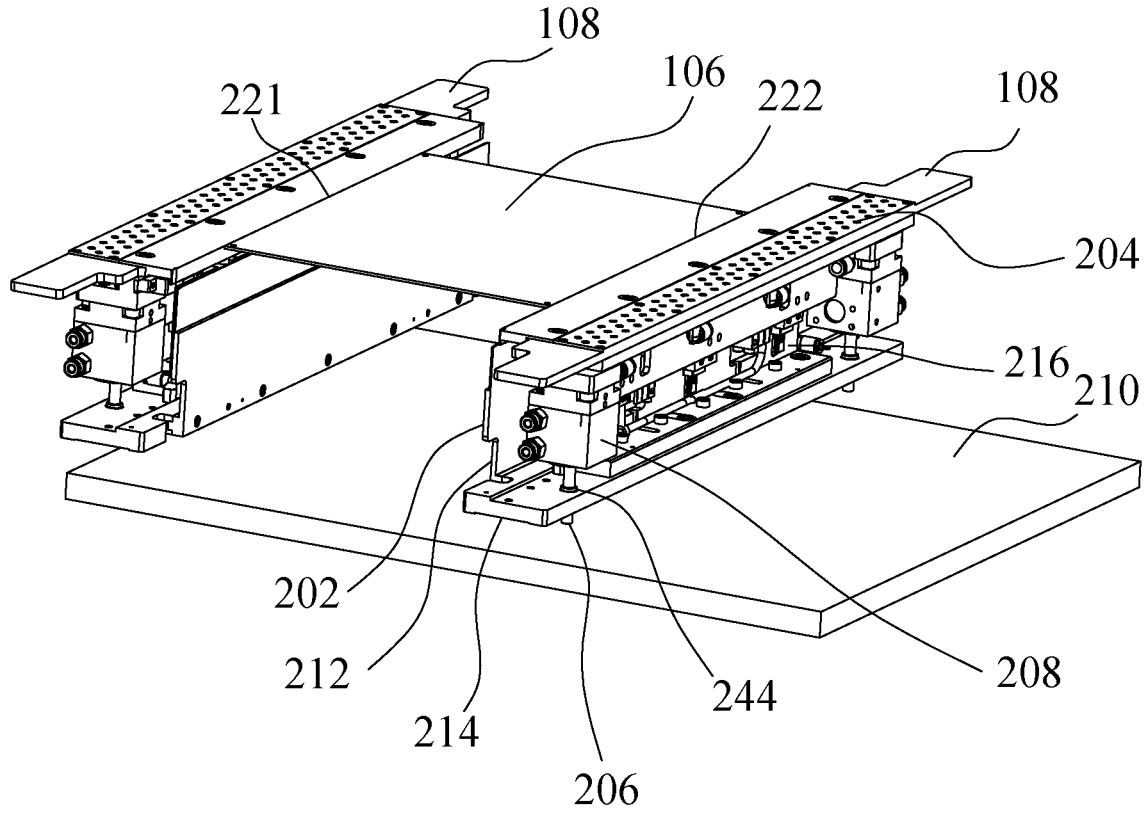
FIGS. 2A and 2B are perspective views of a board and a pair of adjustment assemblies shown in FIG. 1B from different perspectives.
Figure 2B:
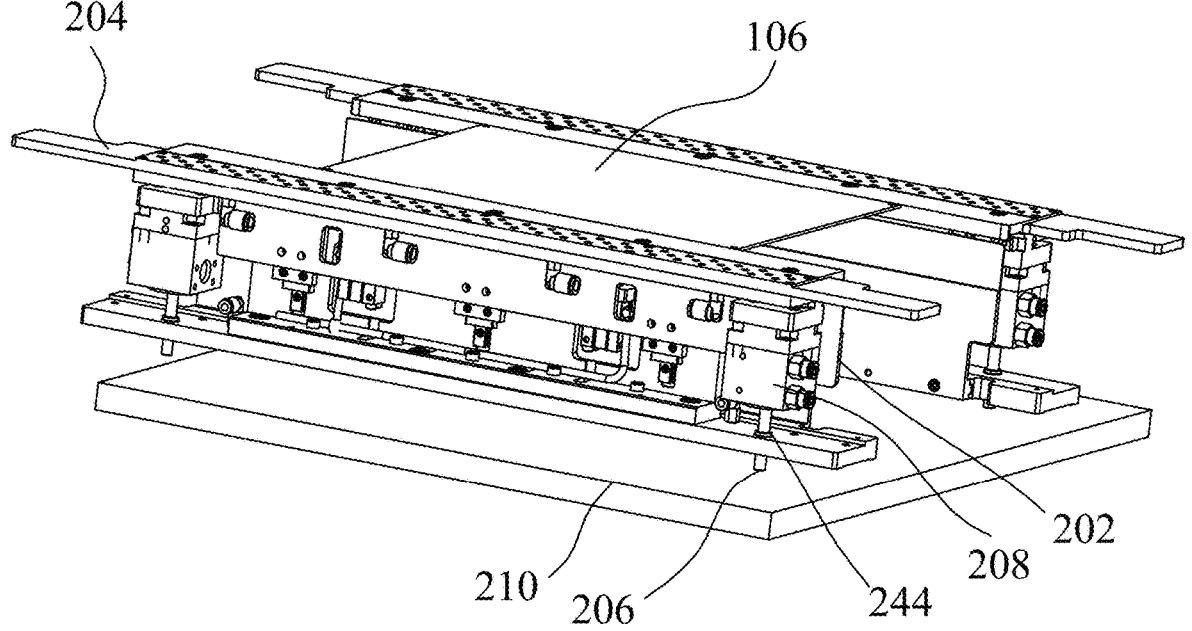
Figure 2C:
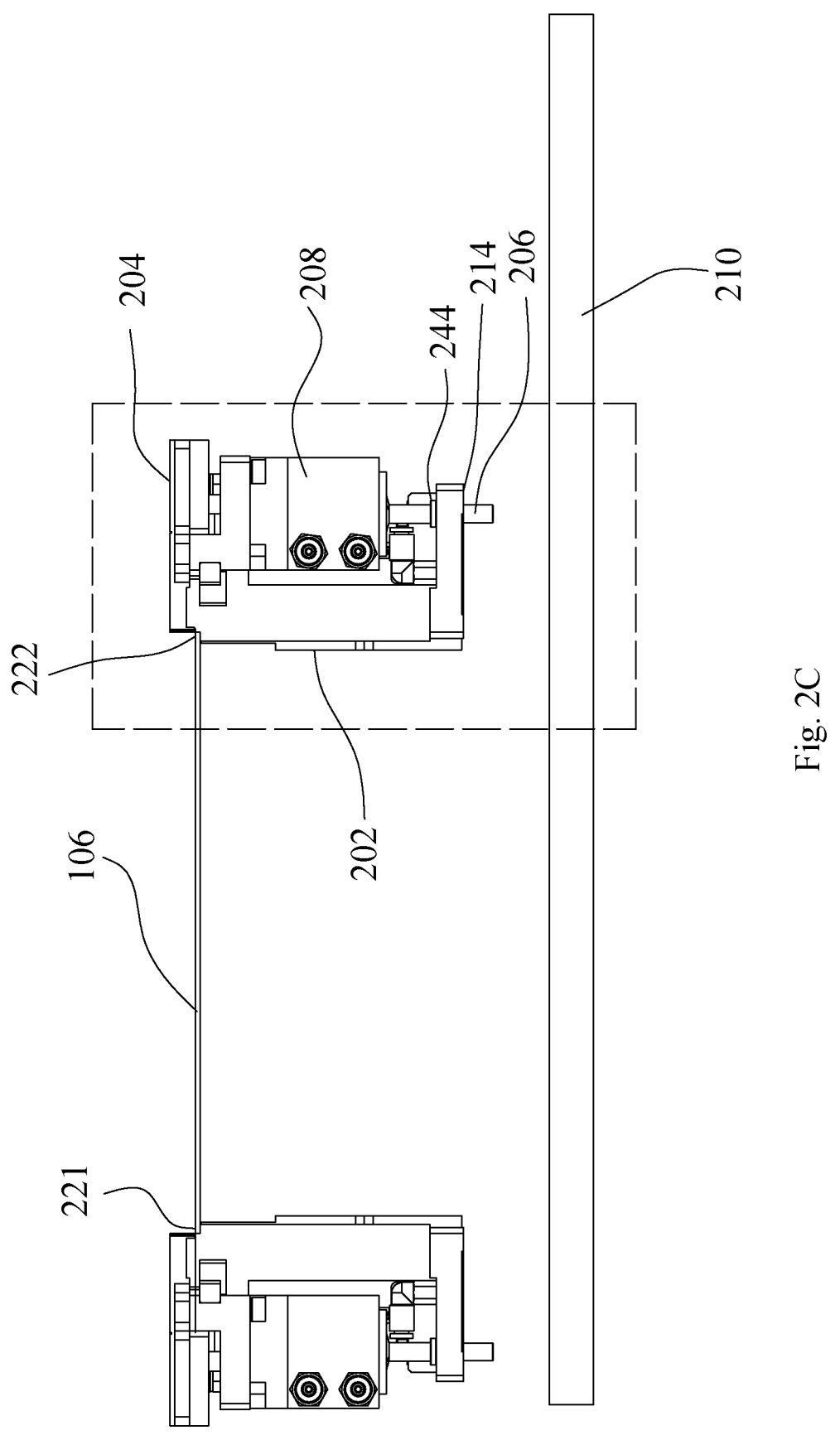
FIG. 2C is a front view of the board and the pair of adjustment assemblies shown in FIG. 2A.

FIGS. 2A and 2B are perspective views of the board 106 and the pair of adjustment assemblies 108 shown in FIG. 1B from different perspectives. FIG. 2C is a front view of the board 106 and the pair of adjustment assemblies 108 shown in FIG. 2A. As shown in FIGS. 2A-2C, two adjustment assemblies 108 of the pair of adjustment assemblies 108 are symmetrically arranged. The adjustment assembly 108 is generally elongated to support the board 106 over a length. In particular, the pair of adjustment assemblies 108 can move along a first direction (i.e., a vertical direction) and are formed by extending along a second direction (i.e., front and rear directions) that is substantially perpendicular to the first direction. In other words, the two adjustment assemblies 108 of the pair of adjustment assemblies 108 are mirror-image arranged about a vertical plane formed by the first direction and the second direction. The board 106 is generally a flat board and is arranged substantially along a horizontal plane formed by the second direction and a third direction (i.e., left and right directions). The board 106 is located substantially between the pair of adjustment assemblies 108, and opposite edges of the board 106 are supported by the pair of adjustment assemblies 108. In other words, the board 106 has a first edge portion (i.e., a left edge portion) 221 and a second edge portion (i.e., a right edge portion) 222 arranged oppositely in the third direction.

As shown in FIGS. 2A-2C, each adjustment assembly 108 of the pair of adjustment assemblies 108 includes a carrying component 202, an alignment component 204, a drive component 210, an alignment component support assembly 216 and a transmission assembly. The carrying component 202 is used to carry the board 106. The alignment component 204 is used to be aligned (i.e., flush) with the board 106, so as to set the position of the board 106. The alignment component support assembly 216 is configured to support the alignment component 204. The drive component 210 is configured to drive the carrying component 202 and the alignment component 204 to move and can adjust a distance between an upper surface of the carrying component 202 and an upper surface of the alignment component 204 to be equal to the thickness of the board. The transmission assembly is configured to enable the drive component 210 to drive the carrying component 202 and the alignment component 204 to move. The transmission assembly includes a guide rod 206 and a clamp 208. The drive component 210 can drive the guide rod 206 to move. The clamp 208 is arranged on the alignment component 204 and is configured to be capable of clamping or releasing the guide rod 206. The transmission assembly is configured such that: when the clamp 208 releases the guide rod 206, the drive component 210 can drive the guide rod 206 to move relative to the carrying component 202 and the alignment component 204; and when the clamp 208 clamps the guide rod 206, the drive component 210 can drive the guide rod 206 and the alignment component 204 to move relative to the carrying component 202. The carrying component 202, the guide rod 206 and the drive component 210 are configured such that: when the drive component 210 drives the carrying component 202 to move, the drive component 210 drives the guide rod 206 to move.

Figure 2D:
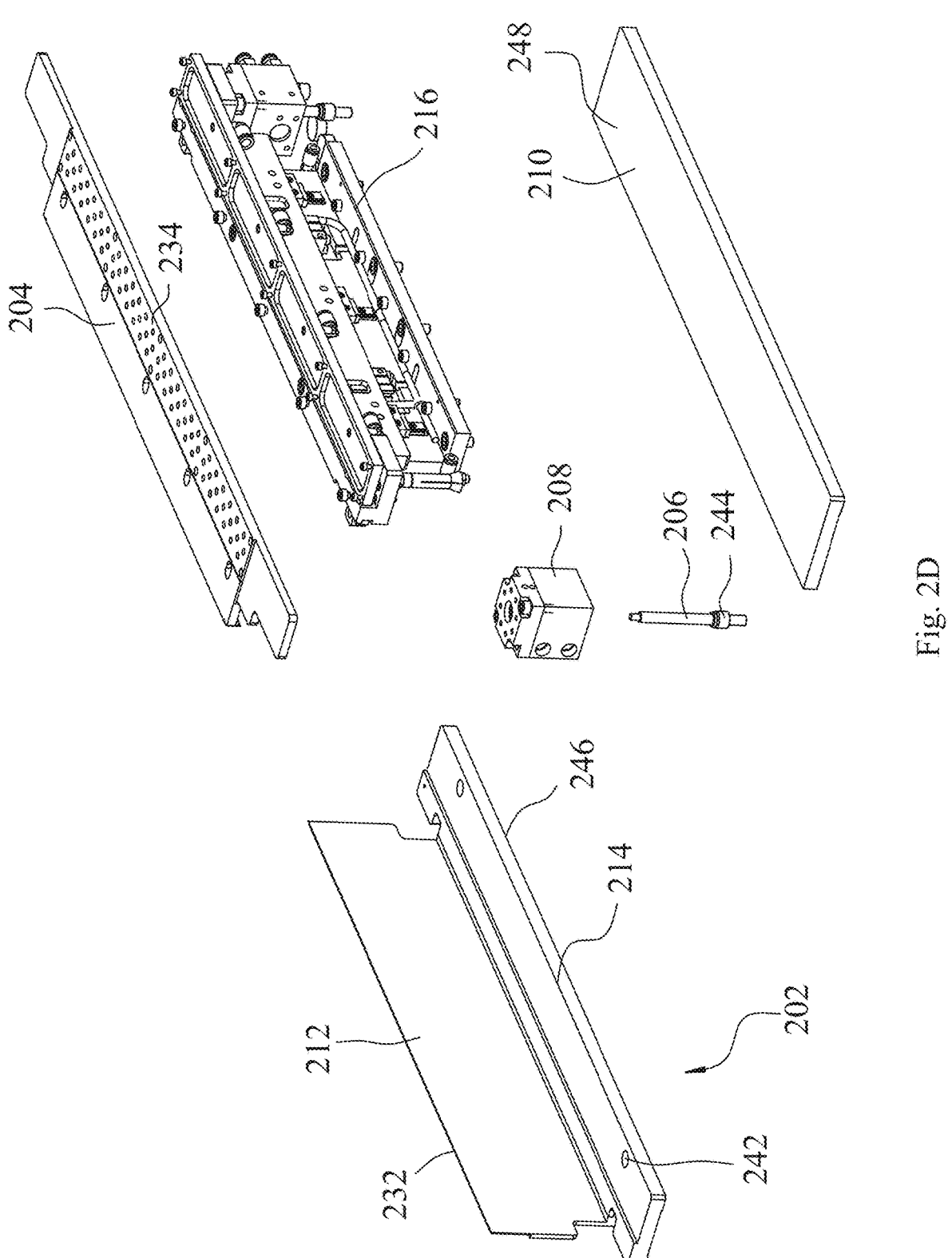
FIG. 2D is an exploded view of a right-hand adjustment assembly.

FIG. 2D is an exploded view of a right-hand adjustment assembly 108. For simplicity of description, the structures and mating relationship of the components of the right-hand adjustment assembly 108 will be described with reference to FIG. 2A, in conjunction with the right half of FIG. 2C. Those skilled in the art can symmetrically arrange a left-hand adjustment assembly 108 according to the structures and mating relationship of the components of the right-hand adjustment assembly 108.

As shown in FIGS. 2A, 2C and 2D, the carrying component 202 is formed by extending substantially along the second direction. The carrying component 202 includes a vertical plate 212 and a transverse plate 214. The vertical plate 212 extends a distance substantially along the first direction and the transverse plate 214 extends a distance substantially along the third direction. A lower end portion of the vertical plate 212 is connected to a left end portion of the transverse plate 214 so that a cross-section of the carrying component is substantially L-shaped. An upper end portion of the vertical plate 212 has an upper surface 232. The upper surface 232 is a planar surface for supporting the board 106. The transverse plate 214 is provided with a through hole 242. The through hole 242 extends through the transverse plate 214 along the first direction, for receiving the guide rod 206. The transverse plate 214 has a lower surface 246 for abutment with the drive component 210, such that the drive component 210 can drive the transverse plate 214 to move.

As shown in FIGS. 2A, 2C and 2D, the alignment component 204 is a plate, which is arranged substantially along the horizontal plane formed by the second direction and the third direction. The alignment component 204 has an upper surface 234. The alignment component support assembly 216 is arranged below the alignment component 204 and is connected to the alignment component 204 for supporting the alignment component 204, to prevent deformation of the alignment component 204 in the second direction.

As shown in FIGS. 2A, 2C and 2D, the clamp 208 is arranged below the alignment component 204 and is connected to the alignment component 204. The clamp 208 can clamp or release the guide rod 206. As an embodiment, the clamp 208 is a jaw having a lower opening. The guide rod 206 can be accommodated in the lower opening. When the jaw clamps the guide rod 206, the clamp 208 and the guide rod 206 do not move relative to each other. When the jaw does not clamp (i.e., releases) the guide rod 206, the clamp 208 and the guide rod 206 move relative to each other. In an embodiment of the present disclosure, the clamp 208 is a gas cylinder. As a gas enters the gas cylinder, a piston of the gas cylinder moves along the horizontal plane toward the guide rod 206 and abuts against the guide rod 206 to clamp the guide rod 206. As the gas is discharged from the gas cylinder, the piston of the gas cylinder moves away from the guide rod 206 and is separated from the guide rod 206 to release the guide rod 206.

It can be understood by those skilled in the art that in other embodiments, the clamp 208 may be of any form and structure, a power source of which may be one or more of gas, liquid, electric power, etc., as long as the clamp 208 can clamp or release the guide rod 206.

As shown in FIGS. 2A, 2C and 2D, the guide rod 206 is a rod formed by extending along the first direction. A lower end of the guide rod 206 can pass through the through hole 242 in the carrying component 202. The guide rod 206 is provided with a blocking portion 244 to block the guide rod 206 from passing completely through the carrying component 202 through the through hole 242. Specifically, the blocking portion 244 is arranged around the guide rod 206. In other words, the blocking portion 244 is formed by extending outwardly from an outer circumferential surface of the guide rod 206 along a radial direction of the guide rod 206. When the lower end of the guide rod 206 passes through the through hole 242 located in the transverse plate 214, it is possible to keep a portion of the guide rod 206 (i.e., a lower end portion of the guide rod 206) below the carrying component 202, and a portion of the guide rod 206 (e.g., upper and middle portions of the guide rod 206) above the carrying component 202, because the outer diameter of the blocking portion 244 is larger than the diameter of the through hole 242.

As shown in FIGS. 2A, 2C and 2D, the drive component 210 is a plate, which is arranged substantially along the horizontal plane formed by the second direction and the third direction. The drive component 210 has an upper surface 248 for abutment with the lower surface 246 of the carrying component 202 and the lower end portion of the guide rod 206. The drive component 210 can move along the first direction, and thus can drive the carrying component 202, the alignment component 204, the guide rod 206 and the clamp 208 to move along the first direction.

In an embodiment of the present disclosure, the drive component 210 of the right-hand adjustment assembly 108 and the drive component 210 of the left-hand adjustment assembly 108 are the same drive plate, so that the same drive source (e.g., motor) can drive the pair of adjustment assemblies 108 simultaneously. It can be understood by those skilled in the art that in other embodiments, the drive component 210 of the right-hand adjustment assembly 108 and the drive component 210 of the left-hand adjustment assembly 108 may be independent.

FIGS. 3A-3E are schematic diagrams showing states of the printing system during operation. The mating relationship and positional relationship between the various components will be described below with reference to FIG. 3A, and the mating relationship between the various components will be described in conjunction with FIGS. 3A-3E, thereby enabling operation of the printing system. It should be noted that a front view of the drive component 210 of the right-hand adjustment assembly 108 is only shown in FIGS. 3A-3E for ease of description. It should also be noted that a wire screen 104 remains stationary during the operation of the printing system.

Figure 3A:
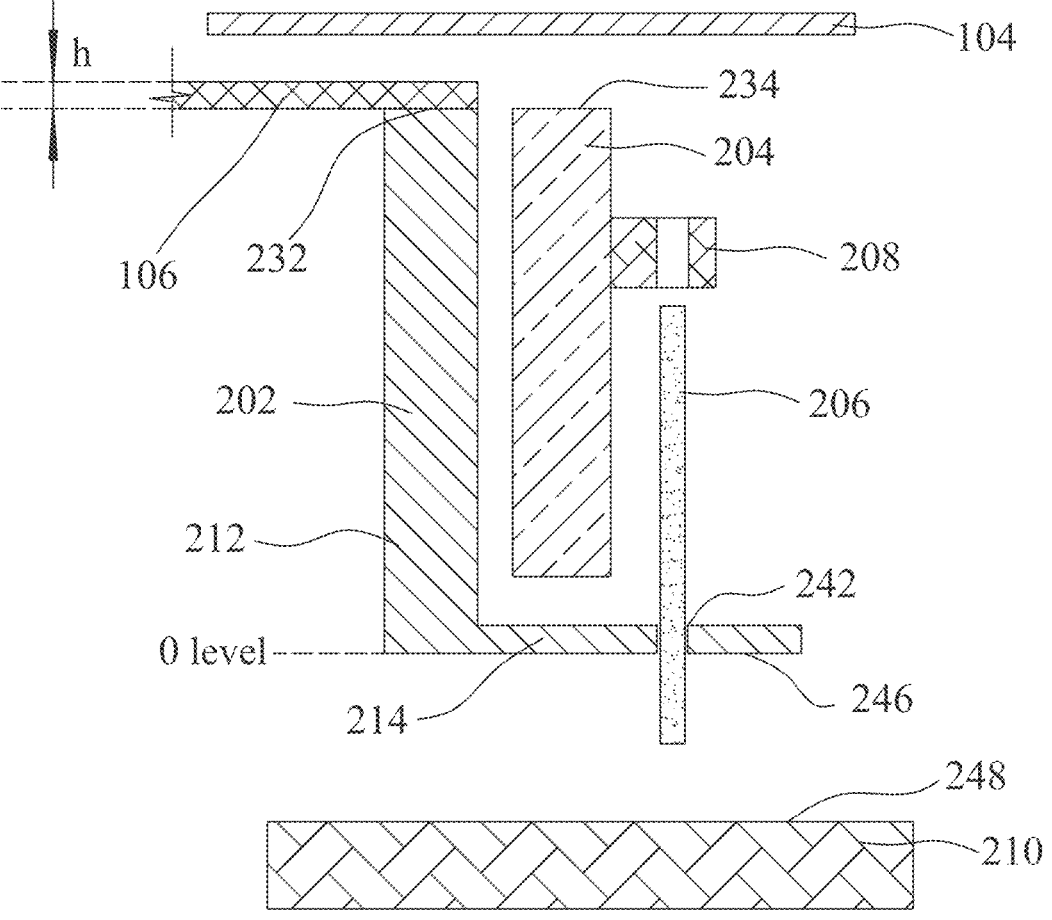
FIGS. 3A-3E are schematic diagrams showing various states of the printing system during operation.

As shown in FIG. 3A, the components of the printing system are located in their initial positions before the printing system prints on the board 106. Specifically, the carrying component 202, the alignment component 204, and the transmission assembly are located between the wire screen 104 and the drive component 210. The alignment component 204 is located on a right side of the vertical plate 212 of the carrying component 202 in the third direction, and above the transverse plate 214 of the carrying component 202 in the first direction. The guide rod 206 passes through the through hole 242 in the carrying component 202. The clamp 208 releases the guide rod 206. The upper surface 232 of the carrying component 202 is at the same height as the upper surface 234 of the alignment component 204. The drive component 210 is separated from the carrying component 202 and the guide rod 206. The height of the lower surface 246 of the carrying component 202 is referred to as "0 level" when the components of the printing system are in the initial positions.

When the components of the printing system are in the initial positions, a worker may place a board 106 of a thickness h on the upper surface 232 of the carrying component 202.

Figure 3B:
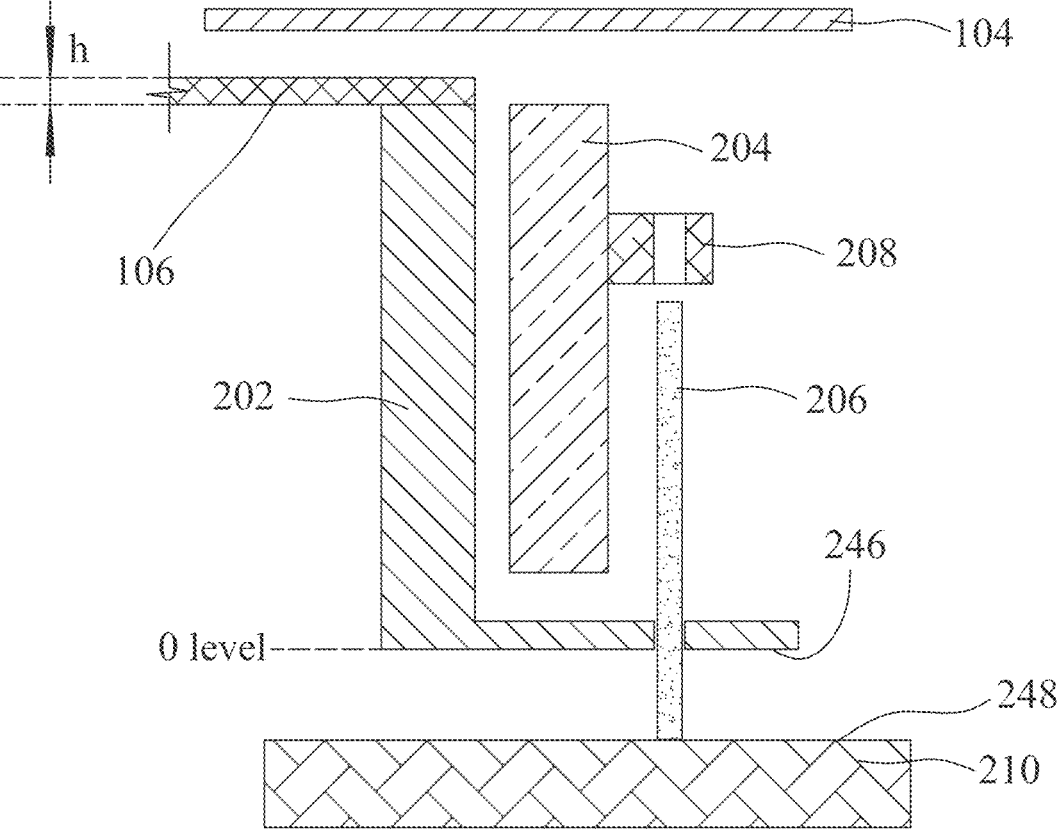

The worker may then operate the drive component 210 to move upwardly along the first direction toward the wire screen 104. As shown in FIGS. 3A-3B, the drive component 210 will move upwardly until the upper surface 248 of the drive component 210 abuts against the lower end of the guide rod 206.

It should be noted that during the operation as shown in FIGS. 3A-3B, the carrying component 202, the alignment component 204 and the guide rod 206 are all maintained in their respective initial positions. The board 106 does not move relative to the wire screen.

Figure 3C:
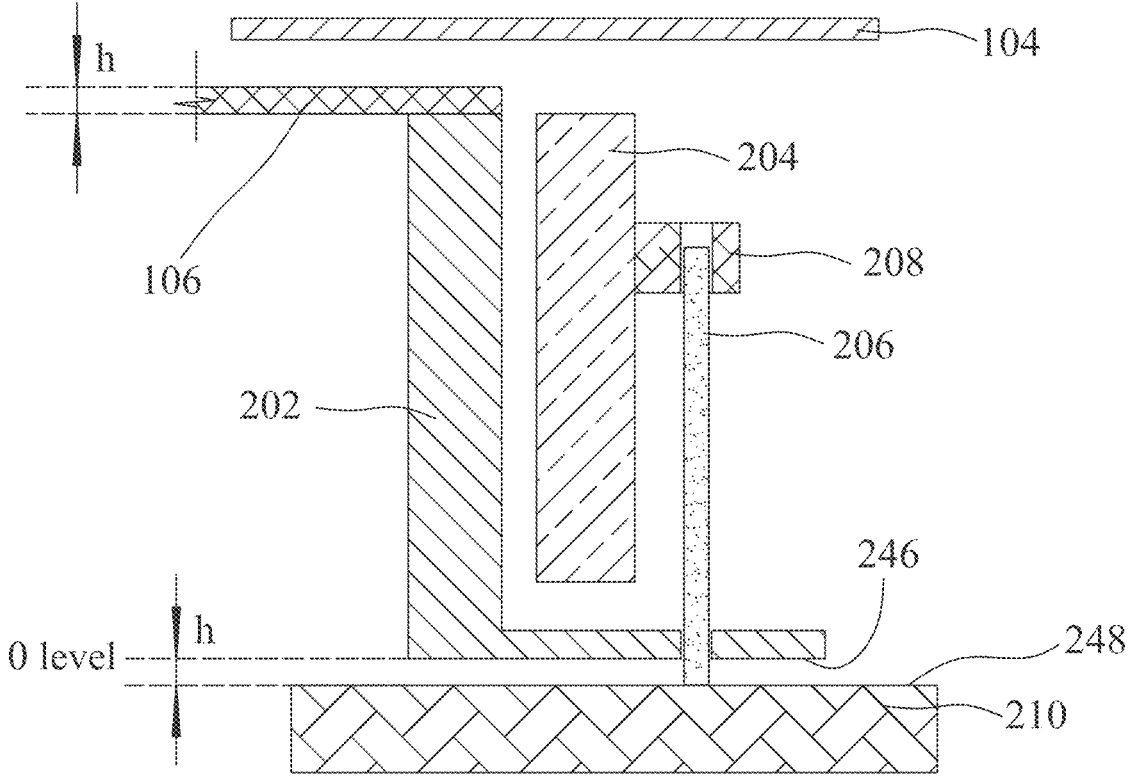

As shown in FIGS. 3B-3C, after the drive component 210 abuts against the lower end of the guide rod 206, the upward movement of the drive component 210 toward the wire screen 104 in the first direction will drive the guide rod 206 to move upwardly toward the wire screen 104 in the first direction, until the height difference between the upper surface 248 of the drive component 210 and the lower surface 246 of the carrying component 202 is equal to the thickness h of the board 106. In other words, the upper surface 248 of the drive component 210 is located at a distance h below the O level in this case.

It should be noted that during the operation as shown in FIGS. 3B-3C, the carrying component 202 and the alignment component 204 are both maintained in their respective initial positions. The board 106 does not move relative to the wire screen.

As shown in FIG. 3C, when the upper surface 248 of the drive component 210 is located at a distance h below the O level, the clamp 208 arranged on the alignment component 204 clamps the guide rod 206. In this way, when the drive component 210 drives the guide rod 206 to move along the first direction, the alignment component 204 can be driven to move along the first direction.

Figure 3D:
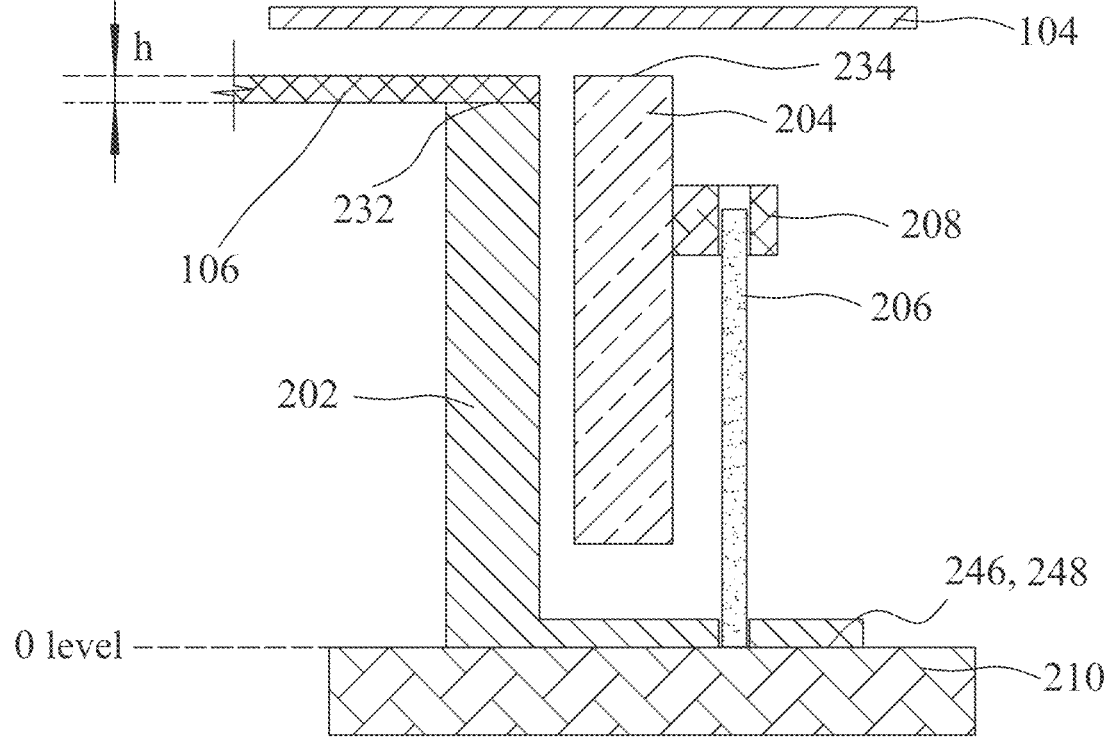

As shown in FIGS. 3C-3D, the drive component 210 continues to move upwardly along the first direction toward the wire screen 104. The drive component 210 drives the alignment component 204 to move upwardly along the first direction until the upper surface 248 of the drive component 210 abuts against the lower surface 246 of the carrying component 202. In this case, the upper surface 248 of the drive component 210 is at the O level, and the height difference between the upper surface 234 of the alignment component 204 and the upper surface 232 of the carrying component 202 in the first direction is equal to the thickness h of the board 106. In other words, the upper surface 234 of the alignment component 204 is at the same height as (i.e., flush with) the upper surface of the board 106.

It should be noted that during the operation as shown in FIGS. 3C-3D, the carrying component 202 is maintained in its initial position. The board 106 does not move relative to the wire screen.

Figure 3E:
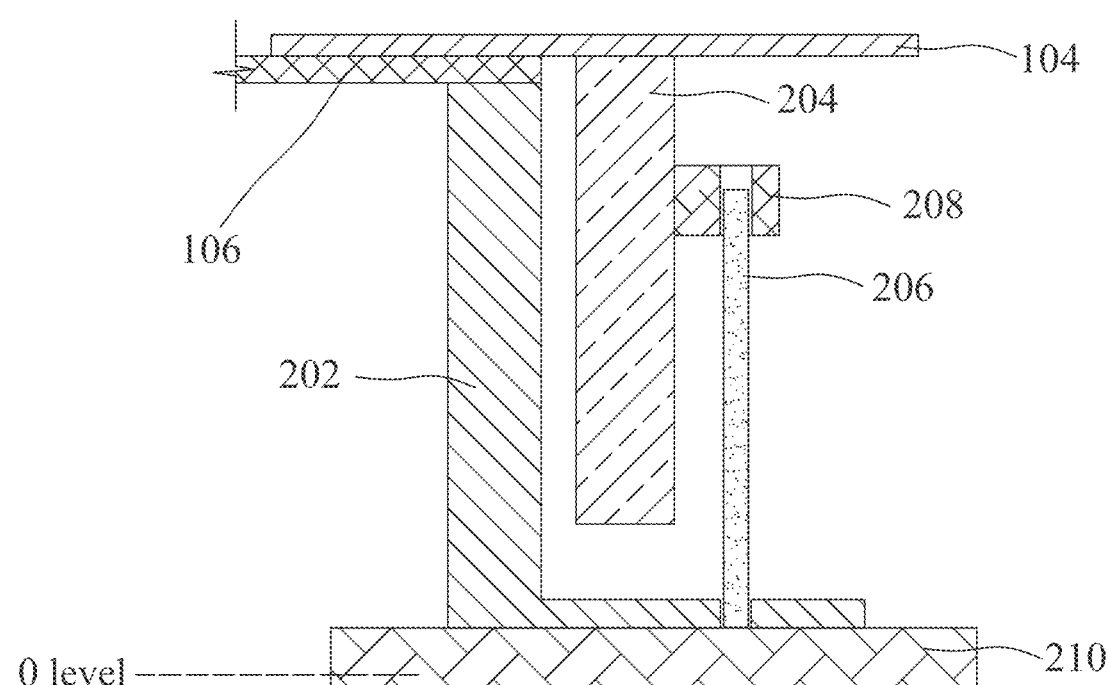

As shown in FIGS. 3D-3E, the drive component 210 continues to move upwardly along the first direction toward the wire screen 104. The drive component 210 drives the carrying component 202, the alignment component 204, the transmission assembly and the board 106 to move upwardly together along the first direction toward the wire screen 104 until the upper surface 234 of the alignment component 204 and the upper surface of the board 106 are together attached to (i.e., abut against) the lower surface of the wire screen 104. The print head (not shown) of the printing device (not shown) on the wire screen 104 abuts against the upper surface of the wire screen 104 and moves relative to the wire screen 104, such that the predetermined pattern is printed on the upper surface of the board 106.

The structure of the printing system of the present disclosure enables a height difference between the upper surface of the alignment component and the upper surface of the carrying component to be adjusted according to the thickness of the board to be processed, such that the height difference between the upper surface of the alignment component and the upper surface of the carrying component is equal to the thickness of the board to be processed, so as to accommodate boards of different thicknesses to be processed.

Figure 4:
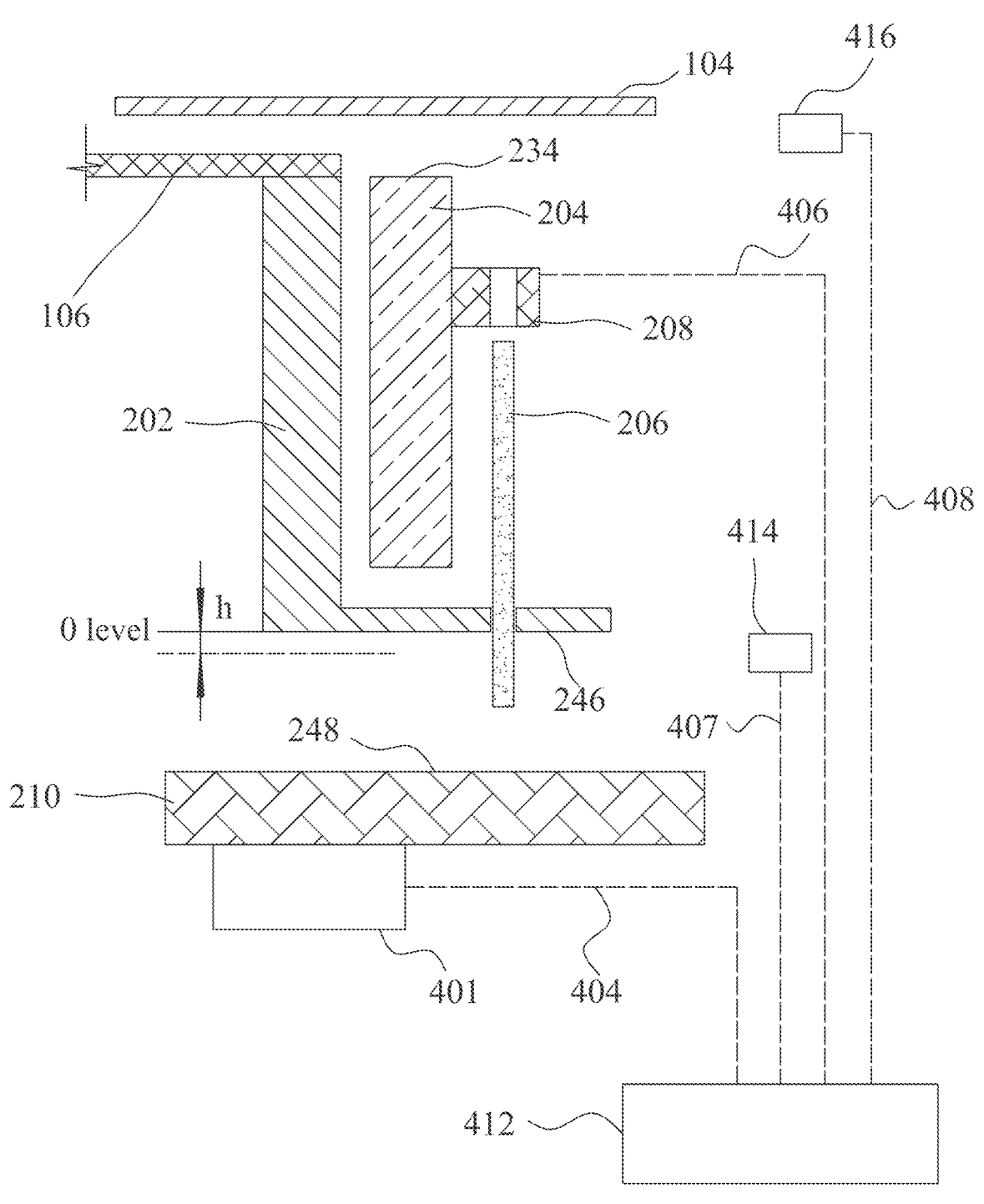
FIG. 4 is a schematic diagram of control process of the printing system of the present disclosure.

FIG. 4 is a schematic diagram of control process of the printing system of the present disclosure. As shown in FIG. 4, the printing system further includes a control device 412, an actuation device 401, a first sensor 414 and a second sensor 416. The actuation device 401 is configured to drive the drive component 210 to move along the first direction. As an example, the actuation device 401 is a motor. The actuation device 401 is communicatively connected to the control device 412 via a signal 404. The control device 412 is configured to control activation and deactivation of the actuation device 401, so as to control whether the drive component 210 moves along the first direction. When the control device 412 control the actuation device 401 to deactivate, the actuation device 401 enables the drive component 210 to keep at a position in the first direction. The clamp 208 is communicatively connected to the control device 412 via a signal 406. The control device 412 is configured to control the clamp 208 to clamp or release the guide rod 206. The first sensor 414 is configured to detect whether the height difference between the upper surface 248 of the drive component 210 and the lower surface 246 of the carrying component 202 is equal to the thickness h of the board 106. The first sensor 414 is communicatively connected to the control device 412 via a signal 407. When the first sensor 414 detects that the height difference between the upper surface 248 of the drive component 210 and the lower surface 246 of the carrying component 202 is equal to the thickness h of the board 106, the first sensor 414 sends a first signal to the control device 412. The control device 412 controls the clamp 208 to clamp the guide rod 206 in accordance with the first signal. The second sensor 416 is configured to detect whether the upper surface of the alignment component 204 is attached to the lower surface of the wire screen 104. The second sensor 416 is communicatively connected to the control device 412 via a signal 408. When the second sensor 416 detects that the upper surface 234 of the alignment component 204 is attached to the lower surface of the wire screen 104, the second sensor 416 sends a second signal to the control device 412. The control device 412 controls the actuation device 401 in accordance with the second signal to deactivate, such that the alignment component 204 and the upper surface of the board 106 at the same height as the upper surface 234 of the alignment component 204 are maintained in place.

Figure 5:
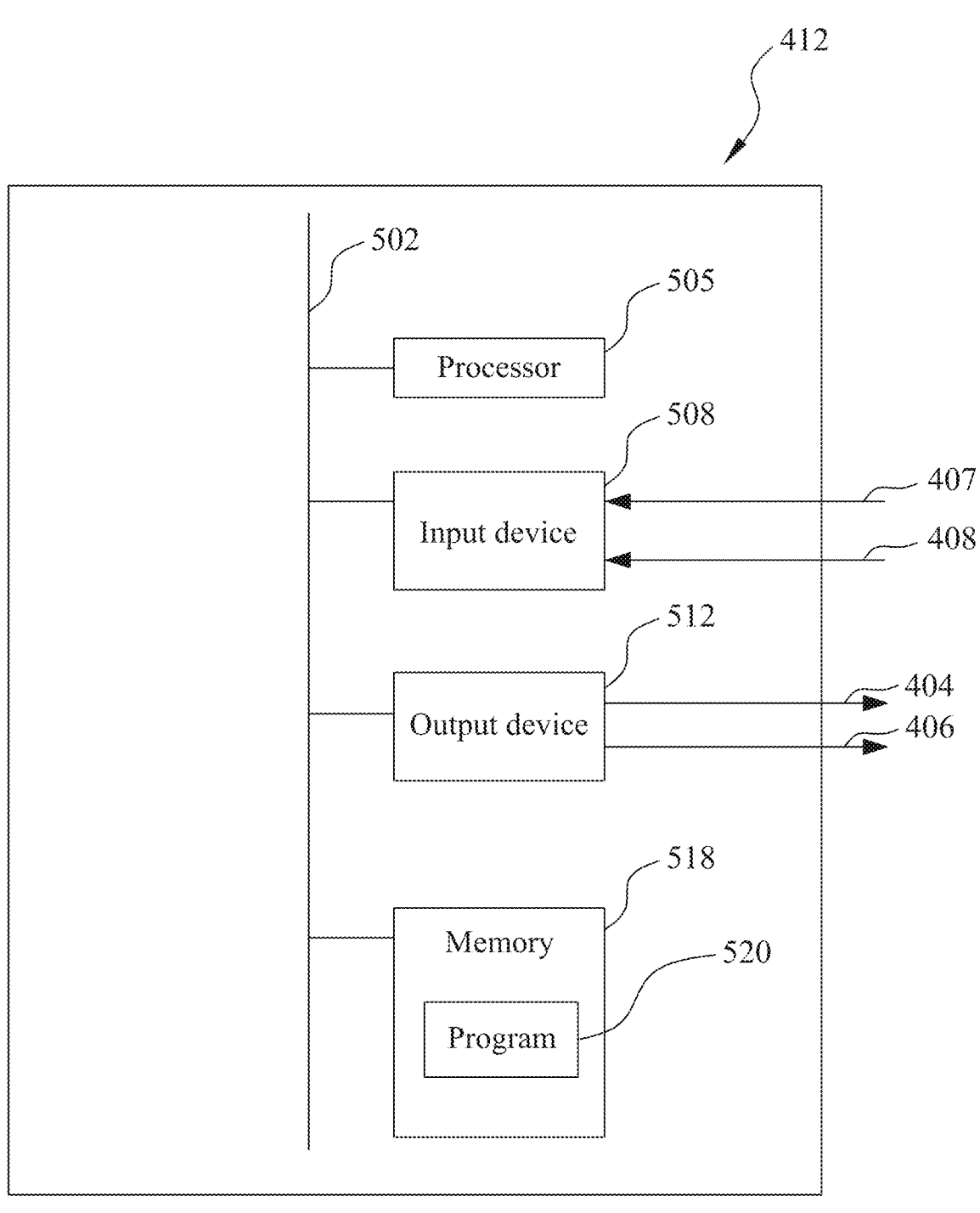
FIG. 5 is a schematic diagram of the internal structure of a control device shown in FIG. 4.

FIG. 5 is a schematic diagram of the internal structure of the control device 412 shown in FIG. 4. As shown in FIG. 4, the control device 412 includes a bus 502, a processor 505, an input device 508, an output device 512, and a memory 518 having a control program 520. The components in the control device 412, including the processor 505, the input device 508, the output device 512 and the memory 518, are communicatively connected to the bus 502, such that the processor 505 can control operations of the input device 508, the output device 512 and the memory 518. Specifically, the memory 518 is configured to store programs, instructions and data, and the processor 505 reads the programs, instructions and data from the memory 518 and can write data to the memory 518. The processor 505 controls the operations of the input device 508 and the output device 512 by means of executing the programs and the instructions read from the memory 518. The input device 508 receives, via connections 407 and 408, foreign signals and data, including the height difference between the upper surface 248 of the drive component 210 and the lower surface 246 of the carrying component 202 being equal to the thickness h of the board 106 detected from the first sensor 414, and the upper surface 234 of the alignment component 204 being attached to the lower surface of the wire screen 104 detected from the second sensor 416. The output device 512 sends control signals via the connections 404 and 406 to the actuation device 401 and the clamp 208, respectively, to control the activation and deactivation of the actuation device 401 and control the clamping or release of the clamp 208.

Figure 6:
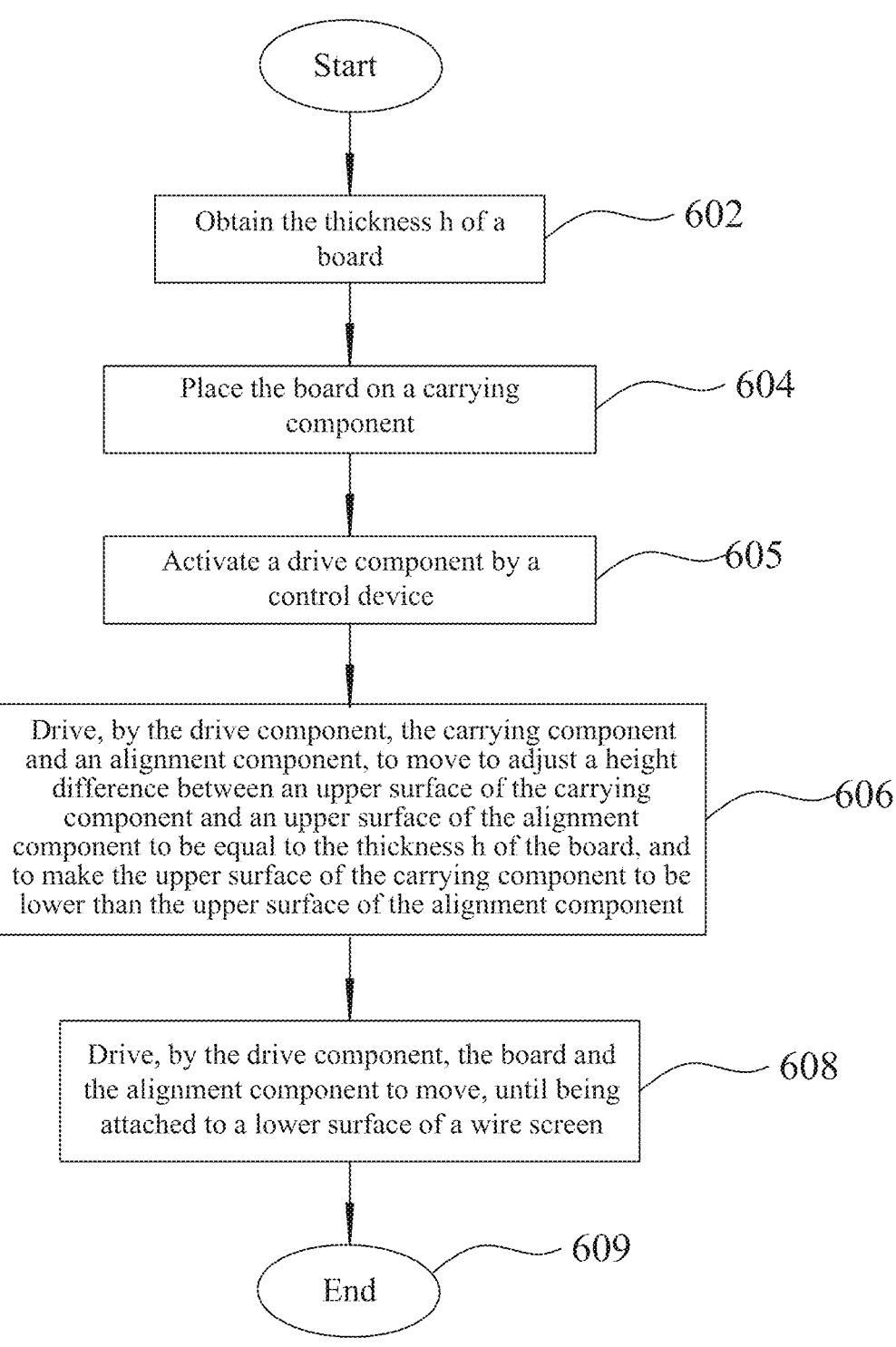
FIG. 6 is a control flow chart about how does a control device control the printing system.

In an embodiment of the present disclosure, a program for implementing the flow chart shown in FIGS. 6-7 is stored in the memory 518 of the control device 412. The processor 505 executes the program stored in the control device 412, such that the control device 412 controls the actuation device 401 and the clamp 208.

FIG. 6 is a control flow chart about how does the control device 412 control the printing system. As shown in FIG. 6, in step 602, the processor 505 obtains the thickness h of a board 106 to be processed. As an embodiment, a worker may measure the thickness h of the board 106 and then input it into the memory 518. As another embodiment, the printing system may include a measuring device. The measuring device is communicatively connected to the control device 412. The measuring device is configured to measure the thickness h of the board 106 to be processed, and the measured data is then sent to the control device 412. Upon completion of step 602, the processor 505 proceeds the operation to step 604.

In step 604, the board 106 is placed on the carrying component 202. As an embodiment, the board 106 may be placed on the carrying component 202 by the worker. As another embodiment, the printing system may include a gripping device. The gripping device is communicatively connected to the control device 412. The gripping device is configured to grip the board 106 to be processed and place the board 106 on the carrying component 202. Upon completion of step 604, the processor 505 proceeds the operation to step 605.

In step 605, the control device 412 activates the drive component 210. Upon completion of step 605, the processor 505 proceeds the operation to step 606.

In step 606, the control device 412 controls the drive component 210 to drive the carrying component 202 and an alignment component 204, to adjust a height difference between an upper surface of the carrying component 202 and an upper surface of the alignment component 204 to be equal to the thickness h of the board, and to make the upper surface of the carrying component 202 to be lower than the upper surface of the alignment component 204. Upon completion of step 606, the processor 505 proceeds the operation to step 608.

In step 608, the control device 412 controls the drive component 210 to drive the board 106 and the alignment component 204 to move, until an upper surface of the board 106 and the upper surface of the alignment component 204 attach to the lower surface of a wire screen 104.

FIG. 7 is a detailed control flow chart of step 606 shown in FIG. 6. As shown in FIG. 7, in step 702, the control device 412 allows the upper surface of the carrying component 202 to be at the same height as the upper surface of the alignment component 204. Upon completion of step 702, the processor 505 proceeds the operation to step 704.

In step 704, the control device 412 controls the drive component 210 to drive the guide rod 206 to move upwardly. Upon completion of step 702, the processor 505 proceeds the operation to step 706.

In step 706, the control device 412 determines whether a first signal is received. In other words, the control device 412 determines whether a distance between tan upper surface of the drive component 210 and a lower surface of the carrying component 202 is equal to the thickness of the board 106. If the control device 412 does not receive the first signal, the processor 505 proceeds the operation to step 704. If the control device 412 receives the first signal, the processor 505 proceeds the operation to step 708.

In step 708, the control device 412 controls the clamp 208 to clamp the guide rod 206. Upon completion of step 708, the processor 505 proceeds the operation to step 710.

In step 710, the control device 412 controls the drive component 210 to move upwardly, so as to drive the guide rod 206, the clamp 208 and the alignment component 204 to move upwardly, until the upper surface of the drive component 210 abuts against the lower surface of the carrying component 202. In other words, when the upper surface of the drive component 210 abuts against the lower surface of the carrying component 202, the height difference between the upper surface of the carrying component 202 and the upper surface of the alignment component is equal to the thickness of the board 106. The processor 505 proceeds the operation back to step 608.

Figure 8:
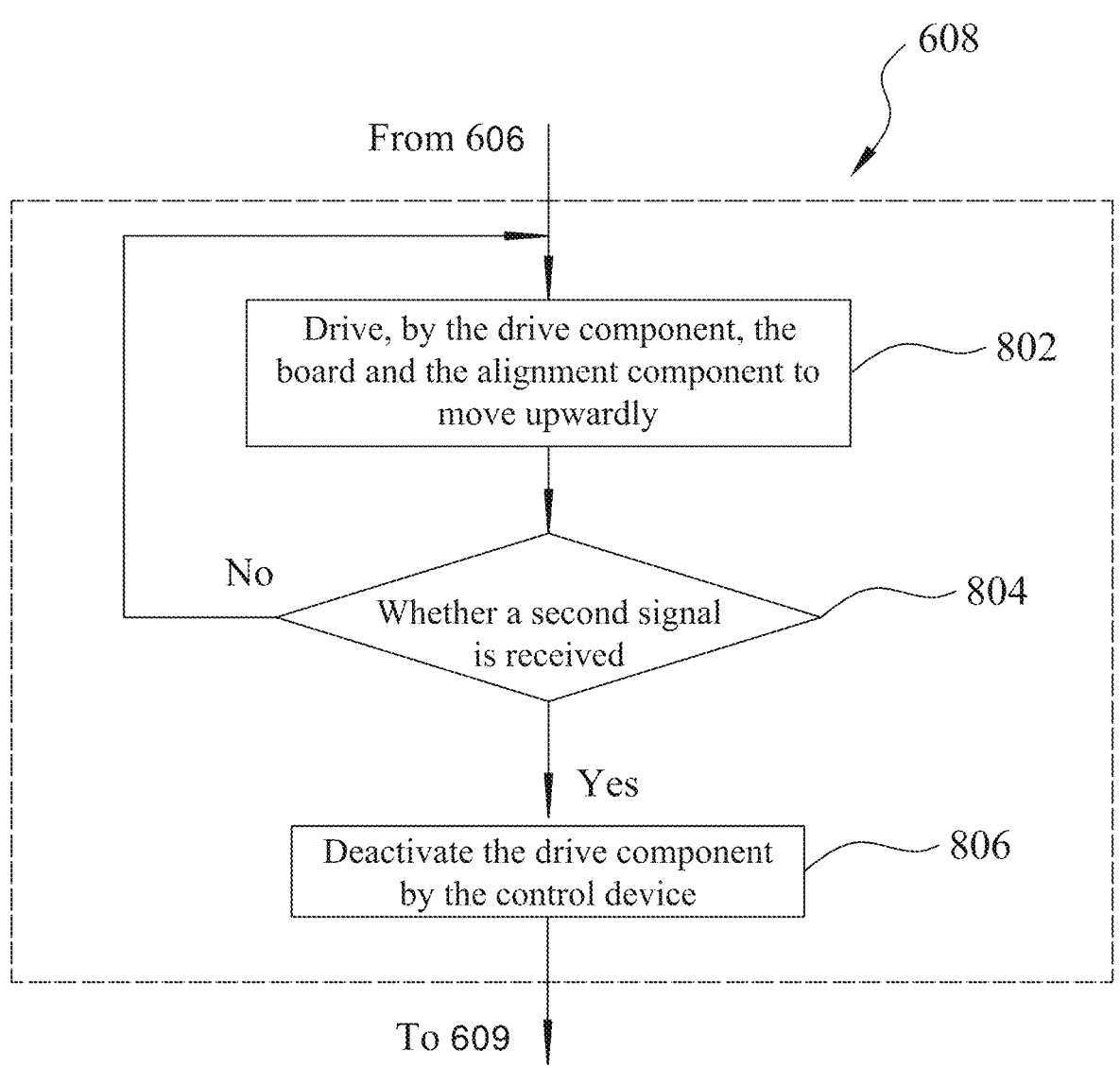
FIG. 8 is a detailed control flow chart of step 608 shown in FIG. 6.

FIG. 8 is a detailed control flow chart of step 608 shown in FIG. 6. As shown in FIG. 8, in step 802, the drive component 210 drives the alignment component 204, the board 106 and the carrying component 202 to move upwardly. Upon completion of step 802, the processor 505 proceeds the operation to step 804.

In step 804, the control device 412 determines whether a second signal is received. In other words, the control device 412 determines whether the upper surface of the board 106 and the upper surface of the alignment component 204 are attached to a lower surface of the wire screen 104. If the control device 412 does not receive the second signal, the processor 505 proceeds the operation to step 802. If the control device 412 receives the second signal, the processor 505 proceeds the operation to step 804.

In step 804, the control device 412 deactivates the drive component 210. The processor 505 proceeds the operation back to step 609.

Although the present disclosure is described with reference to the examples of embodiments outlined above, various alternatives, modifications, variations, improvements and/or substantial equivalents, which are known or anticipated at present or to be anticipated before long, may be obvious to those of at least ordinary skill in the art. In addition, the technical effects and/or technical problems described in this specification are exemplary rather than limiting; Therefore, the disclosure in this specification may be used to solve other technical problems and have other technical effects and/or may solve other technical problems. Accordingly, the examples of the embodiments of the present disclosure as set forth above are intended to be illustrative rather than limiting. Various changes may be made without departing from the spirit or scope of the present disclosure. Therefore, the present disclosure is intended to embrace all known or earlier disclosed alternatives, modifications, variations, improvements and/or substantial equivalents.

What is claimed is:

1. A printing system for printing a board, the printing system comprising:

at least one pair of adjustment assemblies, each of which comprises
a carrying component being configured to carry the board, and
an alignment component;

a drive component being configured to be capable of driving the carrying component and the alignment component to move and being configured to adjust a distance between an upper surface of the carrying component and an upper surface of the alignment component to be equal to the thickness of the board;

an actuation device coupled to the drive component, the actuation device being configured to move the drive component;

a control device coupled to the actuation device, the control device being configured to control an operation of the actuation device;

a first sensor coupled to the control device and configured to detect a height difference between the upper surface of the drive component and a lower surface of the carrying component; and a second sensor configured to detect whether an upper surface of the alignment component is attached to a lower surface of a wire screen, wherein the control device further is configured to
obtain a thickness of a board, and
drive the carrying component and the alignment component from information received from the first sensor to adjust a height difference between an upper surface of the carrying component and an upper surface of the alignment component to be equal to the thickness of the board and making the upper surface of the carrying component to be lower than the upper surface of the alignment component.

2. The printing system of claim 1, wherein each of the at least one pair of adjustment assemblies further comprises:

a transmission assembly comprising:
a guide rod, the drive component being capable of driving the guide rod to move; and
a clamp being arranged on the alignment component and being configured to be capable of clamping or releasing the guide rod.

3. The printing system of claim 2, wherein the transmission assembly is configured such that:

when the clamp releases the guide rod, the drive component is capable of driving the guide rod to move relative to the carrying component and the alignment component; and when the clamp clamps the guide rod, the drive component is capable of driving the guide rod and the alignment component to move relative to the carrying component.

4. The printing system of claim 2, wherein
the carrying component, the guide rod and the drive component are configured such that:

when the drive component drives the carrying component to move, the drive component drives the guide rod to move.

5. The printing system of claim 4, wherein
the carrying component is provided with a through hole, and the guide rod is capable of passing through the through hole.

6. The printing system of claim 2, wherein
the drive component is configured to be capable of driving the carrying component, the alignment component, the guide rod and the clamp to move along a first direction.

7. The printing system of claim 1, wherein
the drive component includes a drive plate.

8. The printing system of claim 1, further comprising:
wherein the wire screen and the drive component are arranged on opposite sides of the carrying component and the alignment component;

wherein the drive component is configured to be capable of driving the board carried by the carrying component and the alignment component to be attached to a lower surface of the wire screen.

9. A method for controlling a printing system for printing a board, the printing system including at least one pair of adjustment assemblies, each of which includes a carrying component being configured to carry the board, and an alignment component, a drive component configured to be capable of driving the carrying component and the alignment component to move and configured to adjust a distance between an upper surface of the carrying component and an upper surface of the alignment component to be equal to the thickness of the board, an actuation device coupled to the drive component, the actuation device being configured to move the drive component, and a control device coupled to the actuation device, the control device being configured to control an operation of the actuation device, the method comprising:

obtaining information from a first sensor configured to detect a height difference between an upper surface of the drive component and a lower surface of the carrying component;

obtaining information from a second sensor configured to detect whether the upper surface of the alignment component is attached to a lower surface of a wire screen, obtaining the thickness of a board;

driving the carrying component and the alignment component by means of the drive component to move so as to adjust the height difference between the upper surface of the carrying component and the upper surface of the alignment component to be equal to the thickness of the board and making the upper surface of the carrying component to be lower than the upper surface of the alignment component.

10. The method for controlling a printing system according to claim 9, the method further comprising:

driving the carrying component, the board and the alignment component by means of the drive component to move until the upper surface of the alignment component is attached to a lower surface of a wire screen, after the step of driving a carrying component and an alignment component by means of a drive component to move so as to adjust a height difference between an upper surface of the carrying component and an upper surface of the alignment component to be equal to the thickness of the board and making the upper surface of the carrying component to be lower than the upper surface of the alignment component.

11. The method for controlling a printing system of claim 9, wherein the step of driving a carrying component and an alignment component by means of a drive component to move so as to adjust a height difference between an upper surface of the carrying component and an upper surface of the alignment component to be equal to the thickness of the board and making the upper surface of the carrying component to be lower than the upper surface of the alignment component comprises:

allowing the upper surface of the carrying component to be at the same height as the upper surface of the alignment component;

driving a guide rod by means of the drive component to move until a distance between an upper surface of the drive component and a lower surface of the carrying component is equal to the thickness of the board;

clamping the guide rod by means of a clamp arranged on the alignment component;

driving the guide rod and the alignment component by means of the drive component to move until the height difference between the upper surface of the carrying component and the upper surface of the alignment component is equal to the thickness of the board.

* * * * *